United States Patent
Kang et al.

(10) Patent No.: US 7,945,227 B2
(45) Date of Patent: May 17, 2011

(54) APPARATUS AND METHOD FOR CONTROLLING VOLTAGE GAIN IN ULTRA WIDEBAND RECEIVING APPARATUS

(75) Inventors: Kyu-Min Kang, Daejon (KR); Sang-In Cho, Daejon (KR); Sang-Sung Choi, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 726 days.

(21) Appl. No.: 11/951,392

(22) Filed: Dec. 6, 2007

(65) Prior Publication Data

US 2008/0139152 A1    Jun. 12, 2008

(30) Foreign Application Priority Data

Dec. 8, 2006    (KR) .................. 10-2006-0125122

(51) Int. Cl.
    *H04B 1/06*    (2006.01)
    *H04K 3/00*    (2006.01)
(52) U.S. Cl. .................. 455/234.2; 455/245.1; 375/345
(58) Field of Classification Search .... 455/234.1–234.2, 455/245.1; 375/345
    See application file for complete search history.

(56) References Cited

U.S. PATENT DOCUMENTS

| 5,450,035 A | 9/1995 | Kinoshita |
| 2003/0026363 A1* | 2/2003 | Stoter et al. .................. 375/345 |
| 2004/0052319 A1* | 3/2004 | Wakamatsu .................. 375/343 |

FOREIGN PATENT DOCUMENTS

| KR | 1020000026900 A | 5/2000 |
| KR | 1020000044158 | 7/2000 |
| KR | 1020010046237 A | 6/2001 |
| KR | 1020050063624 | 6/2005 |

OTHER PUBLICATIONS

You-Jin Cha, et al.; "digitally-controlled automatic gain control circuits for CMOS CCD camera interface" IEE Electronics Letters, vol. 35, No. 22, pp. 1909-1910, Oct. 1999.

* cited by examiner

*Primary Examiner* — Lee Nguyen
(74) *Attorney, Agent, or Firm* — Ladas & Parry LLP

(57) ABSTRACT

Provided is an apparatus and method for controlling a voltage gain in an ultra wideband receiving apparatus. The apparatus includes a register for storing an Automatic Gain Control (AGC) value detected in a section where an AGC operation control signal is "ON"; and a voltage gain controller for generating a voltage gain control value by reading the AGC stored in the register during a section where a reception enable signal is "ON", and transferring the generated voltage gain control value to a voltage gain amplifier.

12 Claims, 4 Drawing Sheets

PLCP: Physical Layer Convergence Protocol
PSDU: PLCP Service Data Unit

APPARATUS AND METHOD FOR CONTROLLING VOLTAGE GAIN IN ULTRA WIDEBAND RECEIVING APPARATUS

CROSS-REFERENCE TO RELATED APPLICATIONS

The present invention claims priority of Korean Patent Application No. 10-2006-0125122, filed on Dec. 08, 2006, which is incorporated herein by reference.

BACKGROUND OF THE INVENTION

1. Field of the Invention

The present invention relates to an apparatus and method for controlling a voltage gain in an ultra wideband receiving apparatus; and, more particularly, to an apparatus and method for controlling a voltage gain in an ultra wideband receiving apparatus, which can facilitate packet detection and improve reception performance in an initial packet detection section by controlling a voltage gain in an initial frame transmission section by using an Automatic Gain Control (AGC) value obtained in a previous frame transmission section and stored in a register.

This work was supported by the Information Technology (IT) research and development program of the Korean Ministry of Information and Communication (MIC) and the Korean Institute for Information Technology Advancement (IITA) [2006-S-071-01, "Development of UWB Solution for High Speed Multimedia Transmission"].

2. Description of Related Art

FIG. 1 is a view showing the structure of a transmission frame used in a general ultra wideband system.

As shown in FIG. 1, the transmission frame used in the ultra wideband system contains a Physical Layer Convergence Protocol (PLCP) preamble 100, a PLCP header 110 and a PLCP Service Data Unit (PSDU) 120.

An ultra wideband receiving apparatus performs packet detection 101, AGC 102, initial timing acquisition, channel estimation, initial frequency error estimation/compensation, and equalizer convergence by using the PLCP preamble 100.

The PLCP header 110 contains a Physical layer (PHY) header, a Medium Access Control (MAC) header, and a Header Check Sequence (HCS). An MAC transmitter generates the PHY header and the MAC header, and transfers them to a baseband modem transmitter. Then, the baseband modem transmitter generates the HCS from the received PHY header and MAC header, and transfers the same to a radio frequency (RF) transmitter.

The ultra wideband receiving apparatus restores a reception signal from the PSDU by continuously operating reception modules such as a rake receiver, a tracking module, an equalizer and a viterbi decoder by using the information acquired from the PLCP preamble 100. Thereafter, the restored reception signal is transferred to an MAC receiver.

FIG. 2 is a block diagram illustrating the configuration of an ultra wideband transmitting/receiving apparatus to which the present invention is applied.

Referring to FIG. 2, the ultra wideband transmitting apparatus to which the present invention is applied includes an MAC transmitter 200, a baseband modem transmitter 210, a digital-to-analog converter (DAC) 220, an RF transmitter 230, a transmission antenna 240 and a reception antenna 250. In addition, the ultra wideband receiving apparatus to which the present invention is applied includes a reception antenna 250, an RF receiver 260, an analog-to-digital converter (ADC) 270, a baseband modem receiver 280 and an MAC receiver 290.

Hereinafter, the ultra wideband transmitting apparatus will be explained in detail. First, the MAC transmitter 200 transfers a transmission signal 211 to the baseband modem transmitter 210. The baseband modem transmitter 210 generates a transmission frame 221 from the received transmission signal 211 according to an ultra wideband transmission standard, and transfers it to the DAC 220. The DAC 220 converts the digital signal, i.e., transmission frame, 221 transferred from the baseband modem transmitter 210 into an analog signal 231, and transfers the same to the RF transmitter 230. Then, the RF transmitter 230 converts the received baseband signal, i.e., analog signal, 231 into an RF signal 241, and outputs it to the transmission antenna 240 through a band pass filter.

An RF signal 241 passing through an ultra wideband channel 245 is received at the RF receiver 260 through the reception antenna 250. Here, the RF signal 251 contains various noises 247 of the ultra wideband channel 245. The RF receiver 260 converts the RF signal 251 into a baseband signal 261, and delivers it to the ADC 270. The ADC 270 converts the received analog signal, i.e., baseband signal, 261 into a digital signal 271, and transfers the same to the baseband modem receiver 280. Then, the baseband modem receiver 280 detects a reception signal 281 from the received digital signal, i.e., transmission frame 271, and transfers it to the MAC receiver 290.

In general, the conventional ultra wideband receiving apparatus judges whether or not a packet is transmitted by using the PLCP preamble 100. This judgment section is called a packet detection section 101. At this time, if the magnitude of the digital signal inputted to the baseband modem receiver 280 through the ADC 270 is processed to be suitable for a real reception signal, the baseband modem receiver 280 can more precisely judge the presence/absence of a frame.

Next, if it is judged that the packet is being currently transmitted in the packet detection section 101, the conventional ultra wideband receiving apparatus controls a voltage gain amplifier of the RF receiver 260 by driving an automatic gain controller of the baseband modem receiver 280 with respect to the corresponding packet. By this control of the voltage gain amplifier, the RF receiver 260 controls a voltage gain of an RF signal, and transfers it to the ADC 270.

At this time, the conventional ultra wideband receiving apparatus uses an initially set reference value as a voltage gain amplifier control signal of the RF receiver 260 in the packet detection section 101, regardless of an actually received input signal. Accordingly, the magnitude of a signal inputted to the baseband modem receiver 280 through the ADC 270 in the packet detection section 101 is very different from that of a signal inputted after the automatic gain controller which is driven in an AGC section 102. As described above, in the conventional ultra wideband receiving apparatus, a reception signal 261 with a voltage gain controlled by the predetermined reference value is inputted to the baseband modem receiver 280 without passing through the automatic gain controller, thereby lowering reception performance.

SUMMARY OF THE INVENTION

An embodiment of the present invention is directed to provide an apparatus and method for controlling a voltage gain in an ultra wideband receiving apparatus, which can facilitate packet detection and improve reception performance in an initial packet detection section by controlling a voltage gain in an initial frame transmission section by using an Automatic Gain Control (AGC) value obtained in a previous frame transmission section and stored in a register.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an aspect of the present invention, there is provided an apparatus of controlling a voltage gain in an ultra wideband receiving apparatus, including: a register for storing an Automatic Gain Control (AGC) value detected in a section where an AGC operation control signal is "ON"; and a voltage gain controller for generating a voltage gain control value by reading the AGC stored in the register during a section where a reception enable signal is "ON", and transferring the generated voltage gain control value to a voltage gain amplifier.

In accordance with another aspect of the present invention, there is provided a method of controlling a voltage gain in an ultra wideband receiving apparatus, including: detecting an Automatic Gain Control (AGC) value for a signal received during a section where an AGC operation control signal is "ON", and storing the AGC value in a register; generating a voltage gain control value by reading the AGC stored in the register during a section where a reception enable signal is "ON"; and transferring the generated voltage gain control value to a voltage gain amplifier.

DESCRIPTION OF SPECIFIC EMBODIMENTS

The advantages, features and aspects of the invention will become apparent from the following description of the embodiments with reference to the accompanying drawings, which is set forth hereinafter, and thus, the present invention will be easily carried out by those skilled in the art. Further, in the following description, well-known arts will not be described in detail if it seems that they could obscure the invention in unnecessary detail. Hereinafter, preferred embodiments of the present invention will be set forth in detail with reference to the accompanying drawings.

Figure 1:
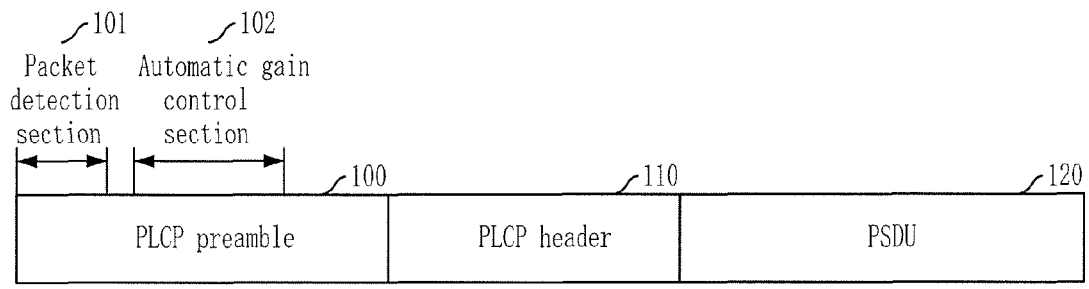
FIG. 1 is a view showing the structure of a transmission frame used in an ultra wideband system.
Figure 2:
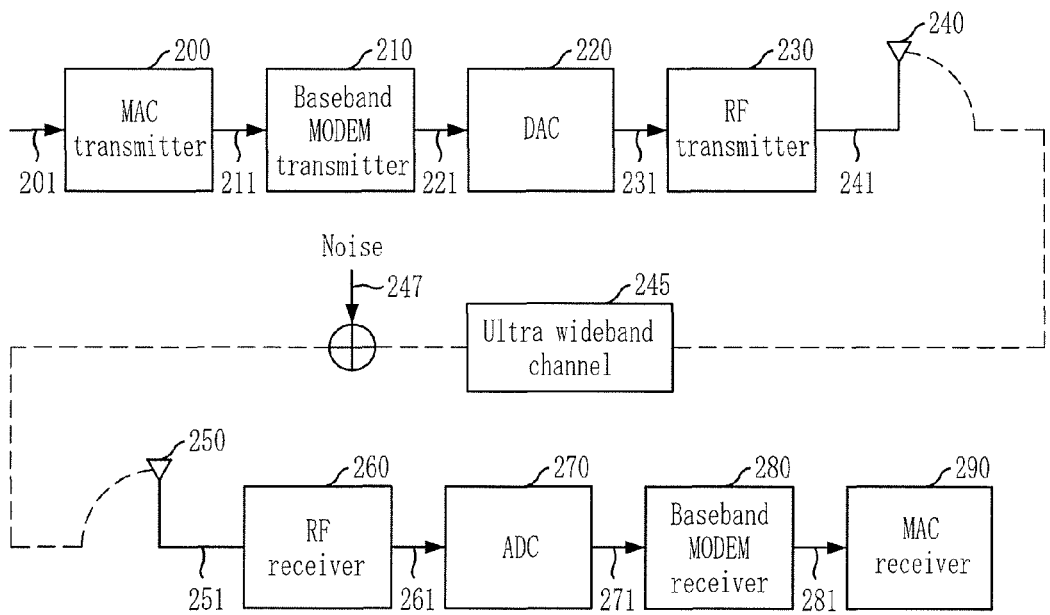
FIG. 2 is a block diagram illustrating the configuration of an ultra wideband transmitting/receiving apparatus to which the present invention is applied.
Figure 3:
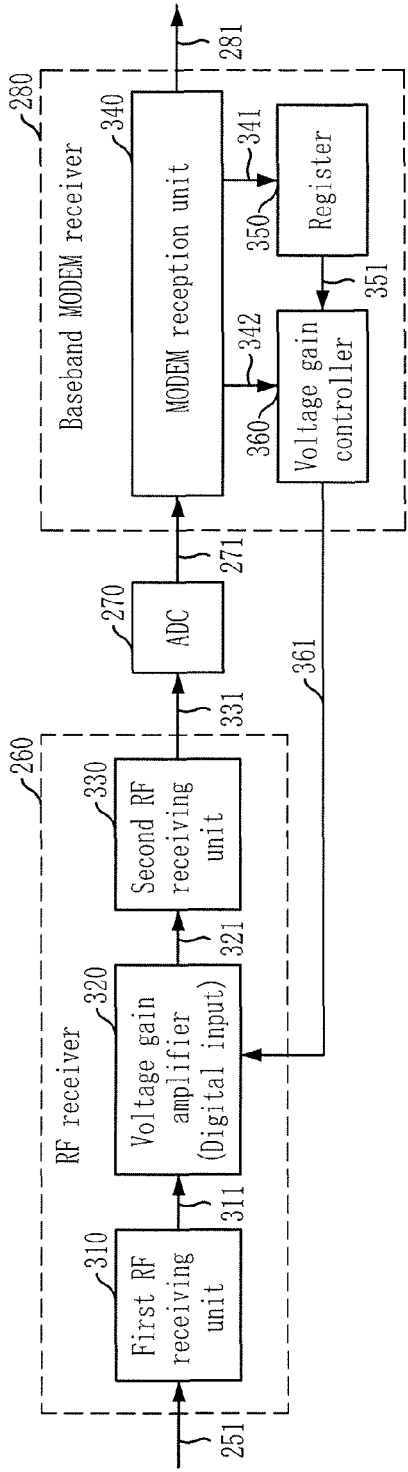
FIG. 3 is a block diagram illustrating the configuration of an apparatus for controlling a voltage gain (digital input) in an ultra wideband receiving apparatus in accordance with a preferred embodiment of the present invention.

FIG. 3 is a block diagram illustrating the configuration of an apparatus for controlling a voltage gain in an ultra wideband receiving apparatus in accordance with a preferred embodiment of the present invention.

As shown in FIG. 3, an RF receiver 260 includes a first RF receiving unit 310, a voltage gain amplifier 320, and a second RF receiving unit 330. A baseband modem receiver 280 includes a modem reception unit 340, a register 350 and a voltage gain controller 360.

The first RF receiving unit 310 filters a reception RF signal 251 inputted from a reception antenna by using a band pass filter, and suppresses noise of an ultra wideband channel.

The voltage gain amplifier 320 receives an RF signal 311 with noise suppressed from the first RF receiving unit 310, and amplifies a voltage gain of the RF signal 311 depending on a voltage gain control value 361 inputted from the voltage gain controller 360 of the invention provided in the baseband modem receiver 280. The voltage gain control value 361 is to provide information on a magnitude of an output signal of the voltage gain amplifier 320.

The second RF receiving unit 330 receives an RF signal 321 with a voltage gain amplified by the voltage gain amplifier 320, converts it into a baseband signal 331, and transfers the same to an ADC 270.

The ADC 270 converts the analog signal (baseband signal) 331 from the second RF receiving unit 330 into a digital signal 271, and delivers it to the modem reception unit 340.

The modem reception unit 340 detects an AGC value from the input signal 271 transferred from the ADC 270, and then stores a resultant value in a corresponding address of the register 350.

When a reception enable signal RX_EX 342 inputted from the modem reception unit 340 is "ON", the voltage gain controller 360 reads out the AGC value 351 stored in the register 350, generates the voltage gain control value 361 for controlling the voltage gain amplifier 320, and provides it to the voltage gain amplifier 320. If the voltage gain amplifier 320 is configured as an analog input terminal, as shown in FIG. 4, a DAC 370 is provided to convert the voltage gain control value into an analog signal and transfer the same to the voltage gain amplifier 320.

The reception enable signal 342 is used to decide whether the AGC value 351 stored in the register 350 is applied as the voltage gain control value 361. Normally, the reception enable signal 342 is generated by an MAC receiver and then provided to the baseband modem receiver 280. For convenience of explanation, in the present invention, it is assumed that the reception enable signal 342 provided from the MAC receiver is transferred to the modem reception unit 340 and then to the voltage gain controller 360.

Figure 4:
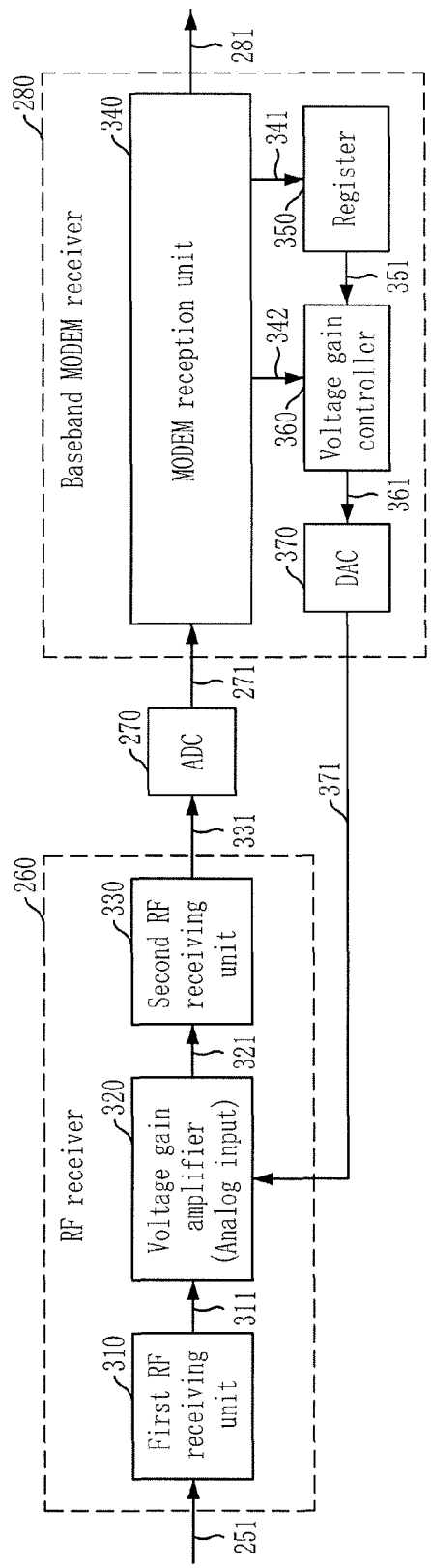
FIG. 4 is a block diagram illustrating the configuration of an apparatus for controlling a voltage gain (analog input) in an ultra wideband receiving apparatus in accordance with a preferred embodiment of the present invention.

FIG. 4 is a block diagram illustrating the configuration of an apparatus of controlling a voltage gain in a state where a voltage gain amplifier has an analog input end.

Figure 5:
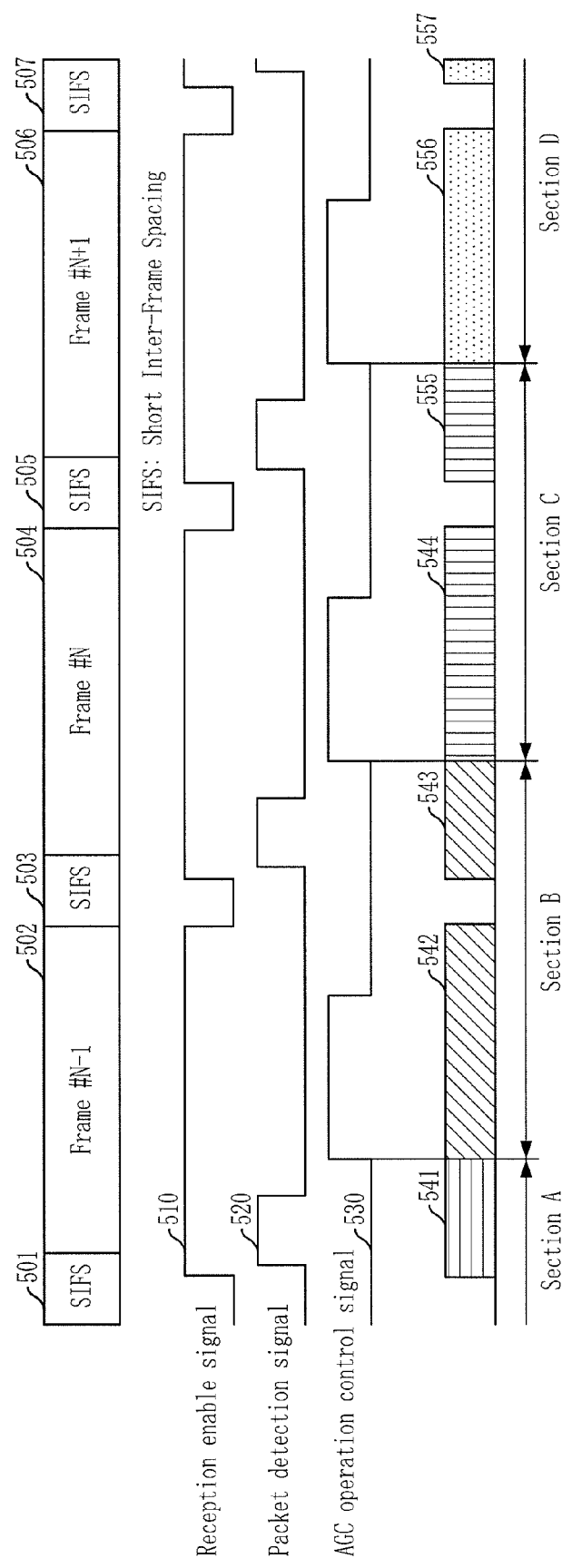
FIG. 5 is a timing diagram describing sections to which a voltage gain control value is applied in accordance with the present invention.

FIG. 5 is a timing diagram describing sections to which a voltage gain control value is applied in accordance with the present invention.

Referring to FIG. 5, upward sections of a reception enable signal 510, a packet detection signal 520 and an AGC operation control signal 530 are "ON" sections, and downward sections thereof are "OFF" sections. Each of frames 502, 504 and 506 is sent after a predetermined Short Inter-Frame Spacing (SIFS) 501, 503, 505 and 507.

For example, the modem reception unit 340 makes the reception enable signal 510 "ON" in the SIFS section 501 before transmitting one frame 502. Here, the reception enable signal 510 maintains the "ON" state in a frame transmission section.

Further, the modem reception unit 340 makes the packet detection signal 520 "ON", and then judges the presence/absence of a packet in a received signal. After detecting the packet, the modem reception unit 340 generates the AGC operation control signal 530 for the received signal.

In the section where the AGC operation control signal 530 is "ON", the modem reception unit 340 computes an AGC value and stores the same in a corresponding address of the register 350.

The voltage gain controller 360 generates a voltage gain control value by using the AGC value read from the register 350 during the "ON" section of the reception enable signal 510, and transfers the generated voltage gain control value to the voltage gain amplifier 320. Thereafter, when the AGC operation control signal 530 is "ON", the modem reception unit 340 generates an AGC value for a new frame and stores it in the register 350.

Referring again to FIG. 5, the voltage gain controller 360 generates a voltage gain control value in a section 542 by using the AGC value read from the register 350, and forwards the generated voltage gain control value to the voltage gain amplifier 320. After the transmission of the $(N-1)^{st}$ frame 502 and before the transmission of the Nth frame 504, the reception enable signal 510 becomes "ON" again. If a packet is detected from the $N^{th}$ frame 504 being transmitted, the packet detection signal 520 for detecting the packet becomes "ON". In an initial section 543 of the frame, an AGC value for a new frame has not been computed. In this case, the voltage gain controller 360 generates a voltage gain control value for the initial section 543 of the frame by using the AGC value for the previous frame, and delivers it to the voltage gain amplifier 320.

Figure 6:
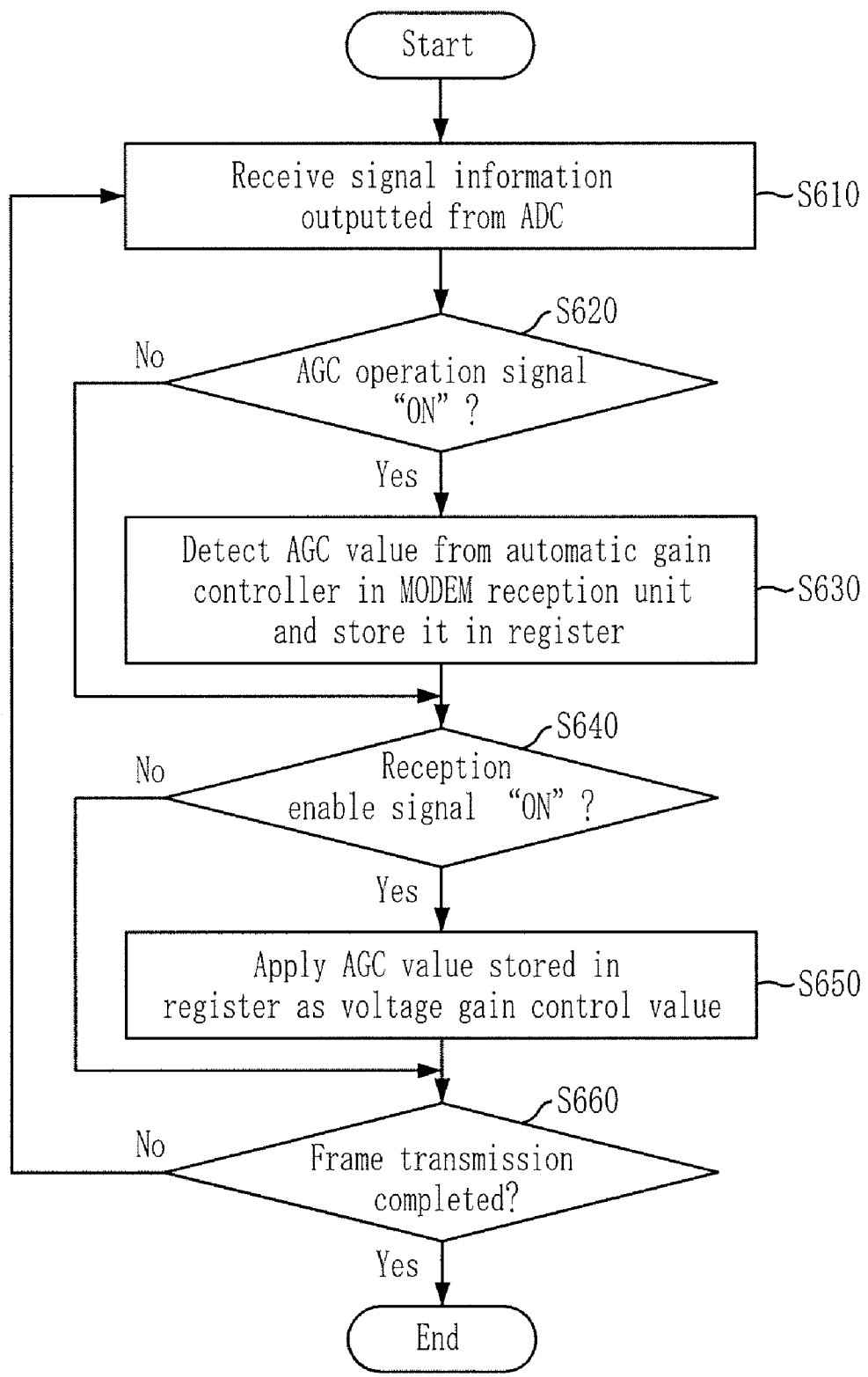
FIG. 6 is a flowchart illustrating a method for controlling a voltage gain in an ultra wideband receiving apparatus in accordance with another preferred embodiment of the present invention.

FIG. 6 is a flowchart illustrating a method for controlling a voltage gain in an ultra wideband receiving apparatus in accordance with another preferred embodiment of the present invention.

First, the modem reception unit 340 receives a digital signal 271 outputted from the ADC 270 in step S610.

Next, the modem reception unit 340 confirms whether an AGC operation control signal 530 is "ON" in step S620. As the confirmation result of step S620, if the AGC operation control signal 530 is "ON", the modem reception unit 340 detects an AGC value from the input digital signal 271 transferred from the ADC 270, and stores a detected value 341 in the corresponding register 350 at step S630. On the other hand, as the confirmation result of step S620, if the AGC operation control signal 530 is not "ON" (OFF section), the modem reception unit 340 performs the step S640 of confirming a reception enable signal 510, by omitting step S630 set forth above.

Thereafter, the process of the present invention confirms whether the reception enable signal 510 is "ON" in step S640. As the confirmation result of step S640, when the reception enable signal 510 is "ON" (operation mode), the voltage gain controller 360 generates a voltage gain control value 361 by using an AGC value 351 read from the register 350, and provides the generated voltage gain control value 361 to the voltage gain amplifier 320 in the RF receiver 260. Then, the voltage gain amplifier 320 controls a voltage gain based on the voltage gain control value 361 in step S650. As the confirmation result of step S640, if the reception enable signal 510 is not "ON" (non-operation mode), the process performs the step S660 of judging whether the transmission of the frame has been finished, by omitting step S650 set forth above.

As the judgment result of step S660, if the transmission of the frame has been finished, the operation of the whole receiver including the voltage gain controller 360 is ended. On the contrary, as the judgment result of step S660, if the transmission of the frame has not been finished, the process returns to step S610 to repeatedly perform the above-mentioned operations.

As described above, the present invention can facilitate packet detection and improve reception performance in an initial packet detection section by generating a voltage gain control value even in an initial frame transmission section by using an AGC value detected in a previous frame transmission section.

The method of the present invention as described above may be implemented by a software program that is stored in a computer-readable storage medium such as CD-ROM, RAM, ROM, floppy disk, hard disk, optical magnetic disk, or the like. This process may be readily carried out by those skilled in the art, and therefore, details of thereof are omitted here.

While the present invention has been described with respect to the particular embodiments, it will be apparent to those skilled in the art that various changes and modifications may be made without departing from the spirit and scope of the invention as defined in the following claims.

What is claimed is:

1. An apparatus for controlling a voltage gain in an ultra wideband receiving apparatus, comprising:
a register configured to store an Automatic Gain Control (AGC) value of an $(N-1)^{th}$ frame, which is detected from a received signal during an AGC operation control section; and
a voltage gain controlling unit configured to generate a voltage gain control value, which is applied to a packet detection section of an $N^{th}$ frame, based on the AGC value, and transfer the voltage gain control value to a voltage gain amplifier;
wherein the voltage gain amplifier amplifies a voltage gain of a received Radio Frequency (RF) signal of the ultra wideband, which is received through the $N^{th}$ frame, based on the voltage gain control value;
wherein the amplified RF signal is converted into a baseband signal;
wherein the storing unit stores an AGC value of the $N^{th}$ frame, which is detected from the baseband signal as the received signal.

2. The apparatus of claim 1, further comprising a digital-to-analog converter (DAC) configured to convert the voltage gain control value into an analog signal, and provide the analog signal to the voltage gain amplifier.

3. The apparatus of claim 1, wherein the voltage gain controlling unit reads the AGC value in the register, and generates the voltage gain control value based on the AGC value, when an enable signal is activated.

4. An ultra wideband receiving apparatus for controlling a voltage gain of a reception signal in an ultra wideband, comprising:
a modem configured to detect an Automatic Gain Control (AGC) value of an $(N-1)^{th}$ frame from a received signal during an AGC operation control section;
a register configured to store the AGC value; and
a voltage gain controlling unit configured to generate a voltage gain control value, which is applied to a packet detection section of an $N^{th}$ frame, based on the AGC value, and transfer the voltage gain control value to a voltage gain amplifier;
wherein the voltage gain amplifier amplifies a voltage gain of a received Radio Frequency (RF) signal of the ultra wideband, which is received through the $N^{th}$ frame, based on the voltage gain control value;

wherein the modem detects an AGC value of the $N^{th}$ frame from a baseband signal, which is converted from the amplified RF signal, as the received signal.

5. The ultra wideband receiving apparatus of claim 4, wherein the modem detects the AGC value from the received signal, stores the AGC value in a corresponding address of the register, when an AGC operation control signal of the AGC operation control section is activated.

6. The ultra wideband receiving apparatus of claim 4, wherein the modem activates an enable signal in Short Inter-Frame Spacing (SIFS) section before transmitting one frame.

7. The ultra wideband receiving apparatus of claim 4, wherein the packet detection section of the $N^{th}$ frame is a section, when a packet detection signal is activated before an AGC operation is performed in a transmission section of the $N^{th}$ frame.

8. A method for controlling a voltage gain in an ultra wideband receiving apparatus, comprising:

detecting an Automatic Gain Control (AGC) value of an $(N-1)^{th}$ frame from a received signal during an AGC operation control section;

generating a voltage gain control value, which is applied to a packet detection section of an $N^{th}$ frame, based on the AGC value; and transferring the voltage gain control value to a voltage gain amplifier;

wherein the voltage gain amplifier amplifies a voltage gain of a received Radio Frequency (RF) signal of the ultra wideband, which is received through the $N^{th}$ frame, based on the voltage gain control value;

wherein the amplified RF signal is converted into a baseband signal;

wherein said detecting the AGC value detects an AGC value of the $N^{th}$ frame from the baseband signal as the received signal.

9. The method of claim 8, further comprising:

converting the voltage gain control value into an analog signal, and providing the analog signal to the voltage gain amplifier; and storing the AGC value in a corresponding address.

10. The method of claim 9, wherein said generating the voltage gain control value reads the AGC value in the corresponding address, and generates the voltage gain control value based on the AGC value, when an enable signal is activated.

11. The method of claim 8, wherein said detecting the AGC value activates an enable signal in Short Inter-Frame Spacing (SIFS) section before transmitting one frame.

12. The method of claim 8, wherein the packet detection section of the $N^{th}$ frame is a section, when a packet detection signal is activated before an AGC operation is performed in a transmission section of the $N^{th}$ frame.

* * * * *